US006313400B1

(12) United States Patent
Mosquera et al.

(10) Patent No.: US 6,313,400 B1
(45) Date of Patent: Nov. 6, 2001

(54) DATA CARD EASILY ASSEMBLED HOUSING

(75) Inventors: Rene Augusto Mosquera, Laguna Niguel; Terry Lee Adams, Huntington Beach; Del Wood, Orange, all of CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/352,443

(22) Filed: Jul. 13, 1999

(51) Int. Cl.$^7$ ..................................................... H05K 9/00
(52) U.S. Cl. ........................ 174/35 R; 361/816; 361/737
(58) Field of Search ........................ 174/35 R; 361/816, 361/818, 737, 752; 257/679; 439/76.1

(56) References Cited

U.S. PATENT DOCUMENTS

| Re. 35,873 | 8/1998 | Simmons et al. ..................... 361/818 |
| 4,713,633 | 12/1987 | Saito et al. ........................... 333/222 |
| 5,053,613 | 10/1991 | Onoda .................................. 235/492 |
| 5,333,100 | 7/1994 | Anhalt et al. ......................... 361/818 |
| 5,386,340 | 1/1995 | Kurz ...................................... 361/737 |
| 5,397,857 | 3/1995 | Farquhar et al. ................... 174/52.1 |
| 5,495,664 | 3/1996 | Semple et al. ......................... 29/823 |
| 5,497,297 | 3/1996 | Kilmer et al. ....................... 361/737 |
| 5,505,628 | 4/1996 | Ramey et al. ....................... 439/76.1 |
| 5,510,959 | 4/1996 | Derstine et al. ..................... 361/816 |
| 5,515,595 | 5/1996 | Kurz ...................................... 29/509 |
| 5,536,905 | 7/1996 | Redman et al. ....................... 174/35 |
| 5,546,278 | 8/1996 | Bethurum .............................. 361/737 |
| 5,548,483 | 8/1996 | Feldman ................................ 361/737 |
| 5,548,485 | 8/1996 | Bethurum et al. .................... 361/737 |
| 5,563,450 | * 10/1996 | Bader et al. .......................... 257/785 |
| 5,572,408 | 11/1996 | Anhalt et al. ......................... 361/737 |
| 5,574,628 | 11/1996 | Persia et al. ........................... 361/737 |
| 5,617,627 | 4/1997 | Semple et al. ......................... 29/509 |
| 5,673,181 | 9/1997 | Hsu ....................................... 361/760 |
| 5,726,867 | 3/1998 | Zarreii .................................. 361/818 |
| 5,739,500 | 4/1998 | Van Beers ............................ 219/117 |
| 5,768,110 | 6/1998 | Frommer et al. .................... 361/755 |
| 5,780,365 | 7/1998 | Nogami ............................... 439/76.1 |
| 5,833,473 | 11/1998 | Betker et al. ....................... 439/76.1 |
| 5,839,907 | 11/1998 | Kuo ..................................... 439/76.1 |
| 5,861,602 | 1/1999 | Cox et al. ........................ 219/121.64 |
| 5,879,170 | 3/1999 | Nogami ............................... 439/76.1 |
| 5,896,274 | 4/1999 | Ishida .................................. 361/737 |

* cited by examiner

Primary Examiner—Dean A. Reichard
Assistant Examiner—Hung V Ngo
(74) Attorney, Agent, or Firm—Roger C. Turner

(57) ABSTRACT

A PC or CF (Compact Flash) card housing has housing halves (32, 34) that each includes a sheet metal shield (50, 70) with a main wall lying in a horizontal plane and with primarily vertical side walls (56, 58, 72, 74), with the side walls of the housing halves overlapping when the housing halves are assembled together. Each shield side wall includes dimples (90, 106) formed by deforming out areas of the sheet metal shield side wall. Each dimple has opposite faces respectively forming a recess and a projection. The recesses (108) of the top housing side walls receive projections (94) of the bottom housing side walls to lock the housing halves together when one is pushed vertically into the other. The dimples have opposite sides (140, 142) connected by bends to surrounding sheet metal, and have lower ends (130, 144) severed from surrounding sheet metal. Each housing half also includes a molded plastic body (62, 80) molded to the side walls of the sheet metal shield, at side wall surfaces opposite the active sides that form interlocking recesses and projections.

10 Claims, 7 Drawing Sheets

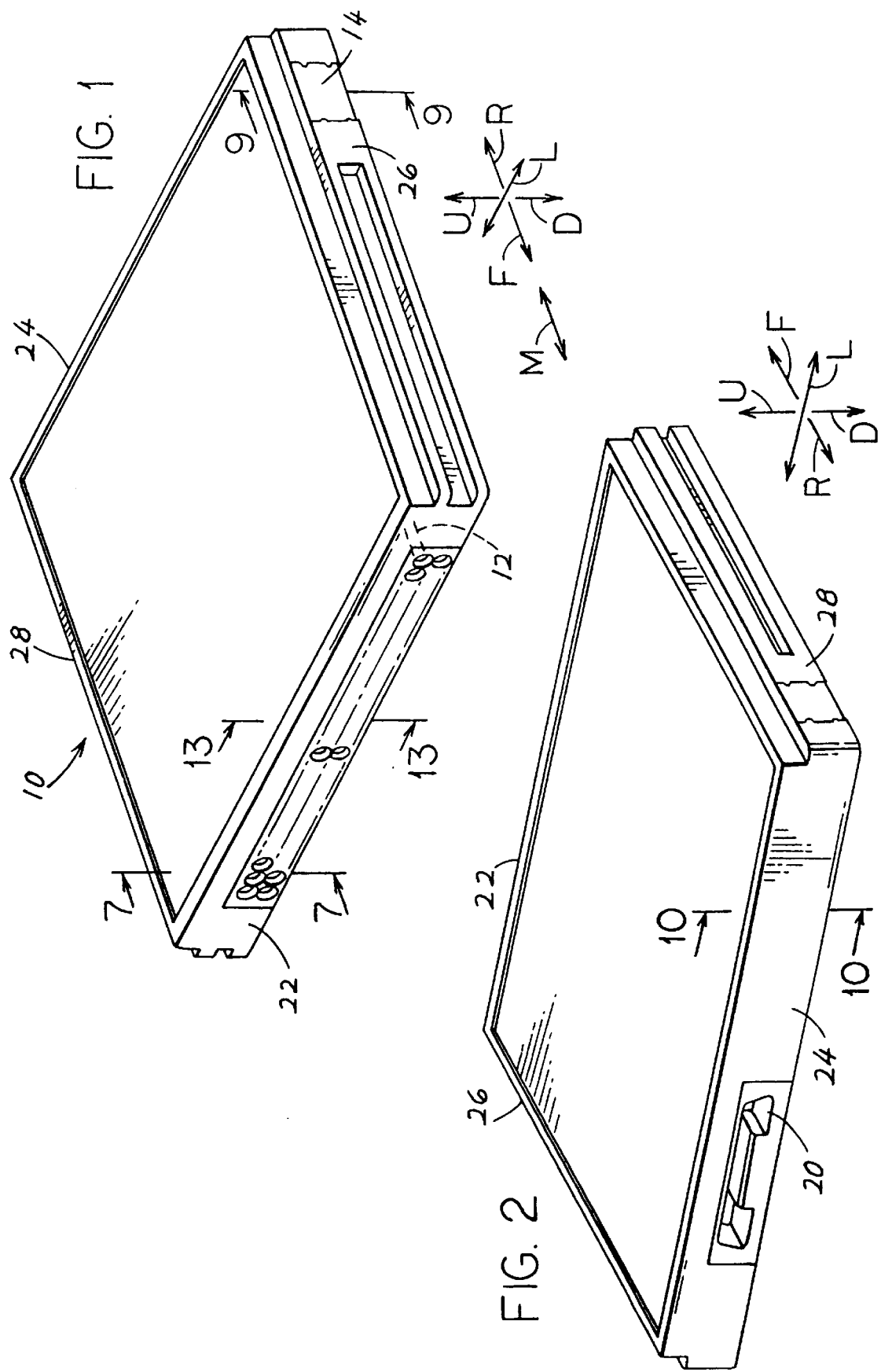

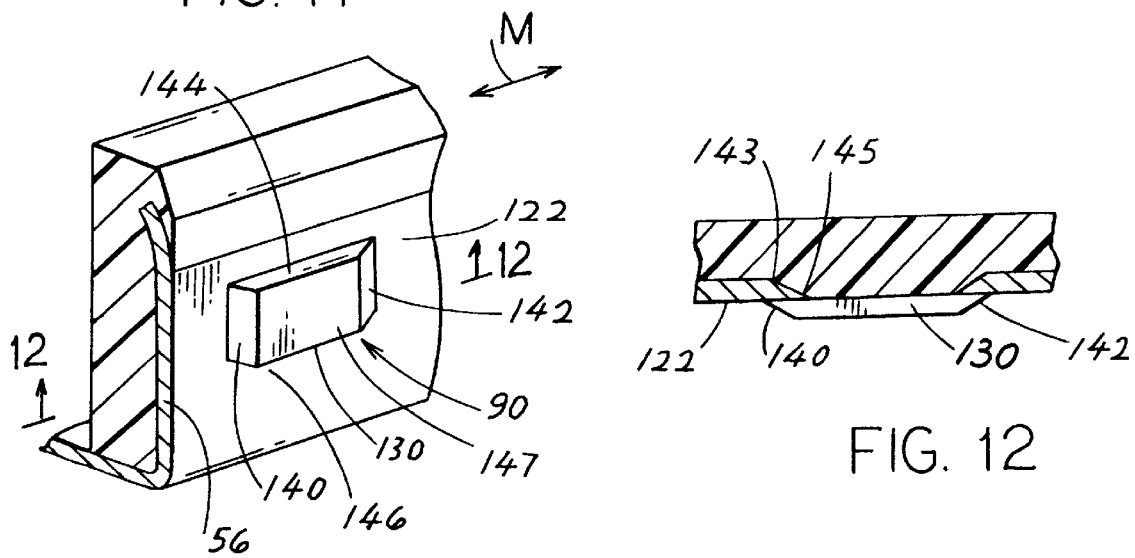
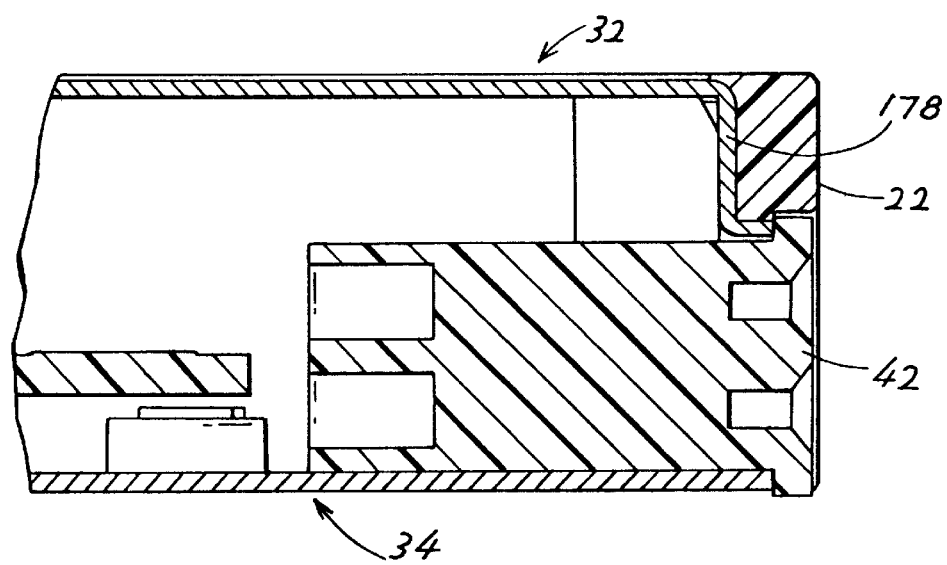

DATA CARD EASILY ASSEMBLED HOUSING

BACKGROUND OF THE INVENTION

PC and CF cards, which are both herein referred to as data cards, commonly include a circuit board and a housing surrounding the circuit board, with the housing including top and bottom housing halves. Each housing half includes a sheet metal shield with a main wall lying in a horizontal plane and with opposite vertical side walls. A data card kit includes such a housing, which is sold to a data card maker that makes its own circuit board and mounts circuit components thereon, and which assembles the housing around the circuit board assembly. Previously, the housing halves have been joined by welding together side walls of the housing halves and/or by allowing sheet metal tabs with free ends extending from one housing half to hook to the other housing half. Welding equipment, whether for metal or plastic, is costly and requires the assembled housing halves to be moved to a special welding station, while hooking the housing halves together with tabs having free ends results in a housing that is not rigid. A pair of data card housing halves that could be readily assembled around a circuit board to create a data card with a rigid housing that provided a high degree of shielding against EMI (Electromagnetic Interference) would be of value.

SUMMARY OF THE INVENTION

In accordance with one embodiment of the present invention, a data card housing is provided which is easily assembled around a circuit board and which results in a rigid housing that provides good EMI (Electromagnetic Interference) shielding. The housing includes top and bottom housing halves, with each housing half including a sheet metal shield having a horizontal main wall and primarily vertical side walls. The side walls of the shields are formed with dimples that each has a projection at one surface and a recess at the other surface. The housing halves are assembled so that the side walls overlap, with dimples of the overlapped side walls locking to each other. Each dimple is formed by half-punching out an area of a shield side wall, with opposite sides of the dimple merging with the rest of the side wall but with at least the bottom of the dimple cut free of an adjacent area of the shield side wall. As a result, the bottom forms a downwardly-facing surface for locking to the dimple of the other shield.

Each shield half preferably includes front and rear walls, with the front wall shielding opposite sides of the front of the card, which lie beyond a front connector, and with the rear walls shielding much of the rear of the card. Each housing half preferably includes a molded plastic body forming a beam extending along each shield side. Each molded plastic body includes a body portion that extends into a recess of a dimple, or which backs up the dimple.

The novel features of the invention are set forth with particularity in the appended claims. The invention will be best understood from the following description when read in conjunction with the accompanying drawings.

BRIEF DESCRIPTION OF THE DRAWINGS

FIG. 1 is a front and top isometric view of a data card constructed in accordance with the present invention.

FIG. 2 is a rear and top view of the data card of FIG. 1.

FIG. 11 is a sectional isometric view showing a dimple of the lower housing half.

FIG. 12 is a view taken on line 12—12 of FIG. 11.

FIG. 13 is a sectional view taken on line 13—13 of FIG. 1, but without the front connector contacts.

DESCRIPTION OF THE PREFERRED EMBODIMENTS

Figure 3:
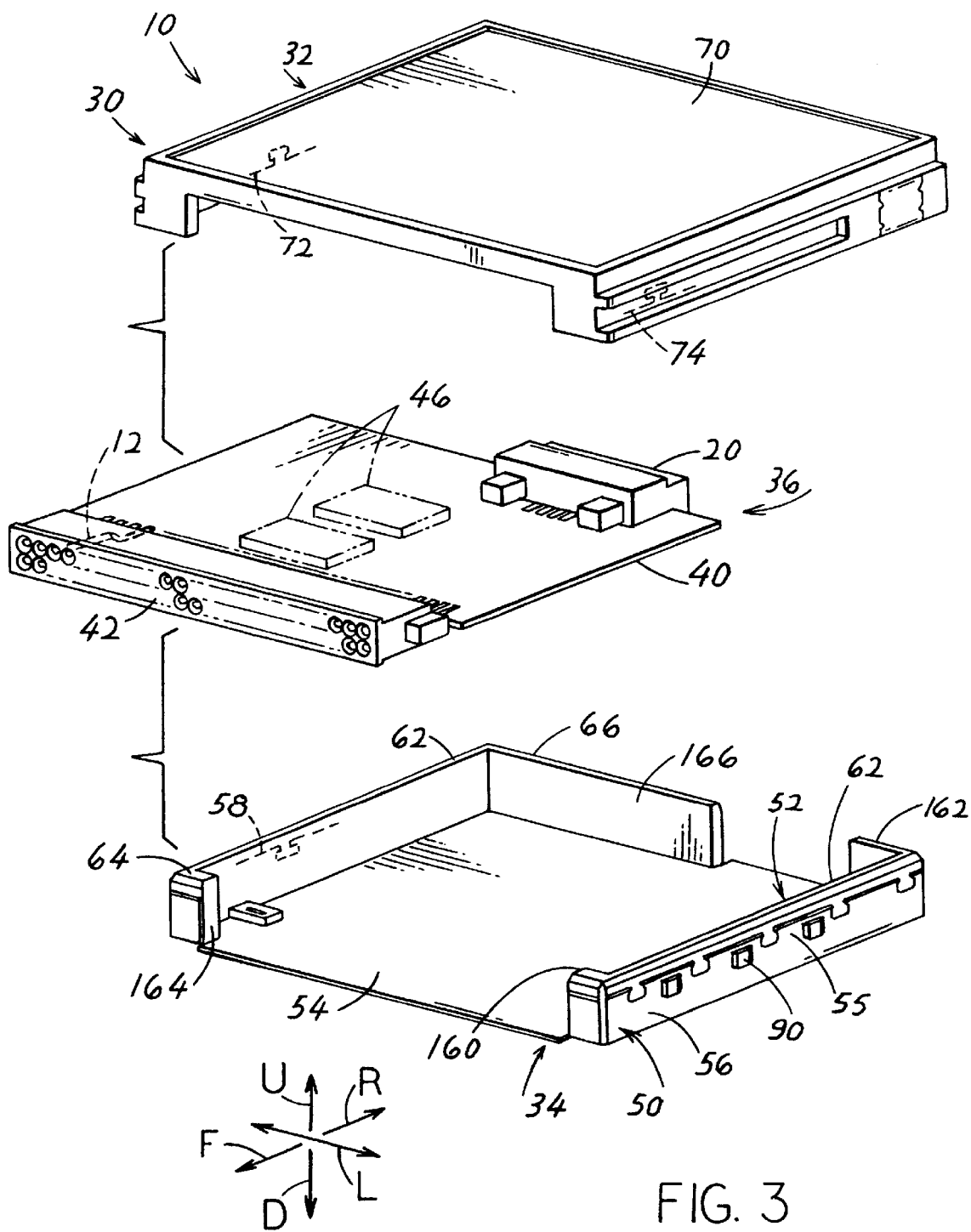
FIG. 3 is an exploded top and front isometric view of the data card of FIG. 1.

FIG. 1 illustrates a data card 10 of the CF (Compact Flash) type which is designed to be slid in a forward direction F into a slot of an electronic device until contacts of the electronic device engage contacts 12 of the card. The particular card is a Type II card, and it has a grounding contact surface 14 near its rear end for engaging a grounding contact on the electronic device. As shown in FIG. 2, the particular data card has a rear connector 20 at its rear end for connection to peripheral equipment such as a modem, digital camera, audio equipment, etc. The card has front and rear ends 22, 24 spaced in forward and rearward directions F, R which are longitudinal directions M. The card also has opposite sides 26, 28 spaced in lateral directions L.

FIG. 3 shows that the housing 30 of the data card includes top and bottom housing halves 32, 34. A circuit board assembly 36 lies between the housing halves and is mechanically and electrically (against electromagnetic interference) shielded by the housing. The assembly 36 includes a circuit board 40, a front connector 42 that includes the contacts 12, and the rear connector (I/O connector) 20. The purchaser of the data card kit, which includes the parts shown in FIG. 3, except for the circuit board, commonly constructs the circuit board with multiple traces and with circuit components 46 to fit a particular application.

Each housing half, such as the bottom housing half 34, includes a sheet metal shield 50 and a molded plastic body 52 that is overmolded to the shield. In overmolding, plastic is molded against the sheet metal shield, with tabs 55 formed in the shield being captured in the molded plastic to fix the plastic body to the shield. The bottom shield 50 includes a bottom main wall 54 lying in a primarily horizontal plane, and a pair of upstanding vertical side walls 56, 58 that are spaced apart in a lateral direction L. The body includes laterally opposite body side beams 62 and front and rear body end beams 64, 66. The molded plastic body does not cover the bottom wall 54 of the sheet metal shield.

Figure 4:
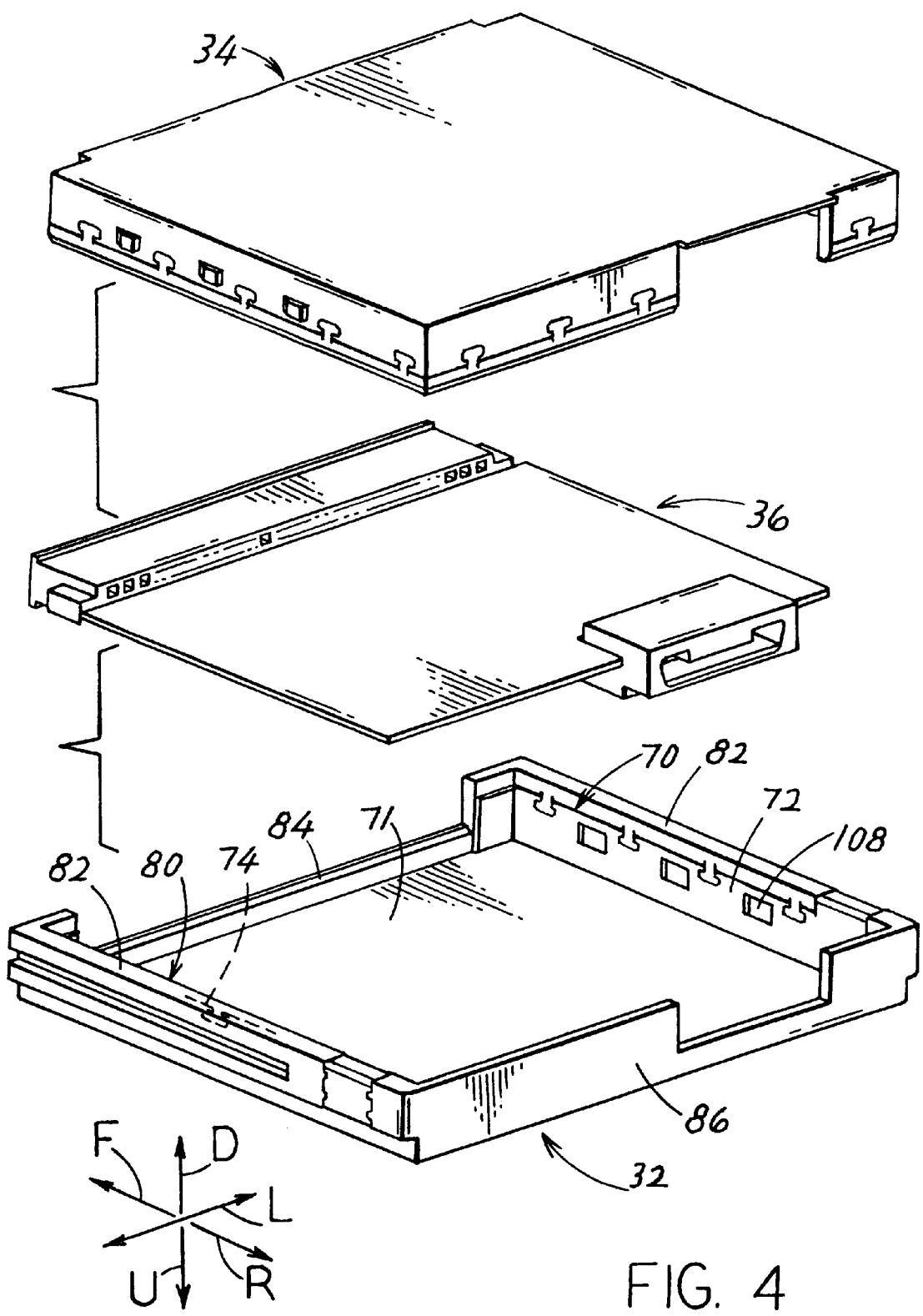
FIG. 4 is an upside-down exploded view of the data card of FIG. 3.
Figure 5:
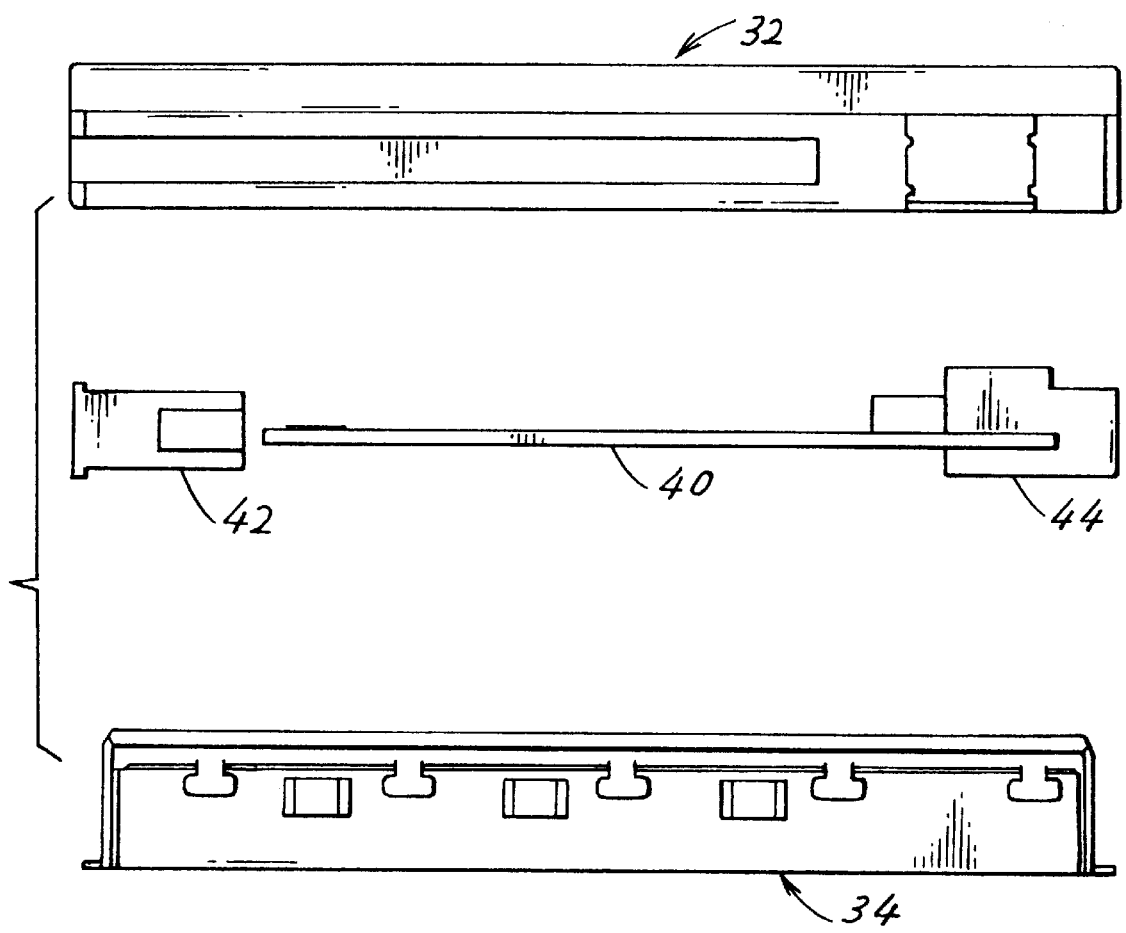
FIG. 5 is an exploded side elevation view of the data card of FIG. 3.

FIG. 4, which is an upside-down view, shows that the top housing half 32 is constructed similarly to the bottom housing half, with a sheet metal shield 70 having a top main wall 71 lying in a primarily horizontal plane and having depending side walls 72, 74. The upper housing also includes a molded plastic body 80 molded to the sheet metal shield and having body side beams 82 and front and rear body end beams 84, 86. The shapes of the sheet metal shields, without the molded plastic bodies, are shown in FIG. 6 at 50 and 70.

Figure 6:
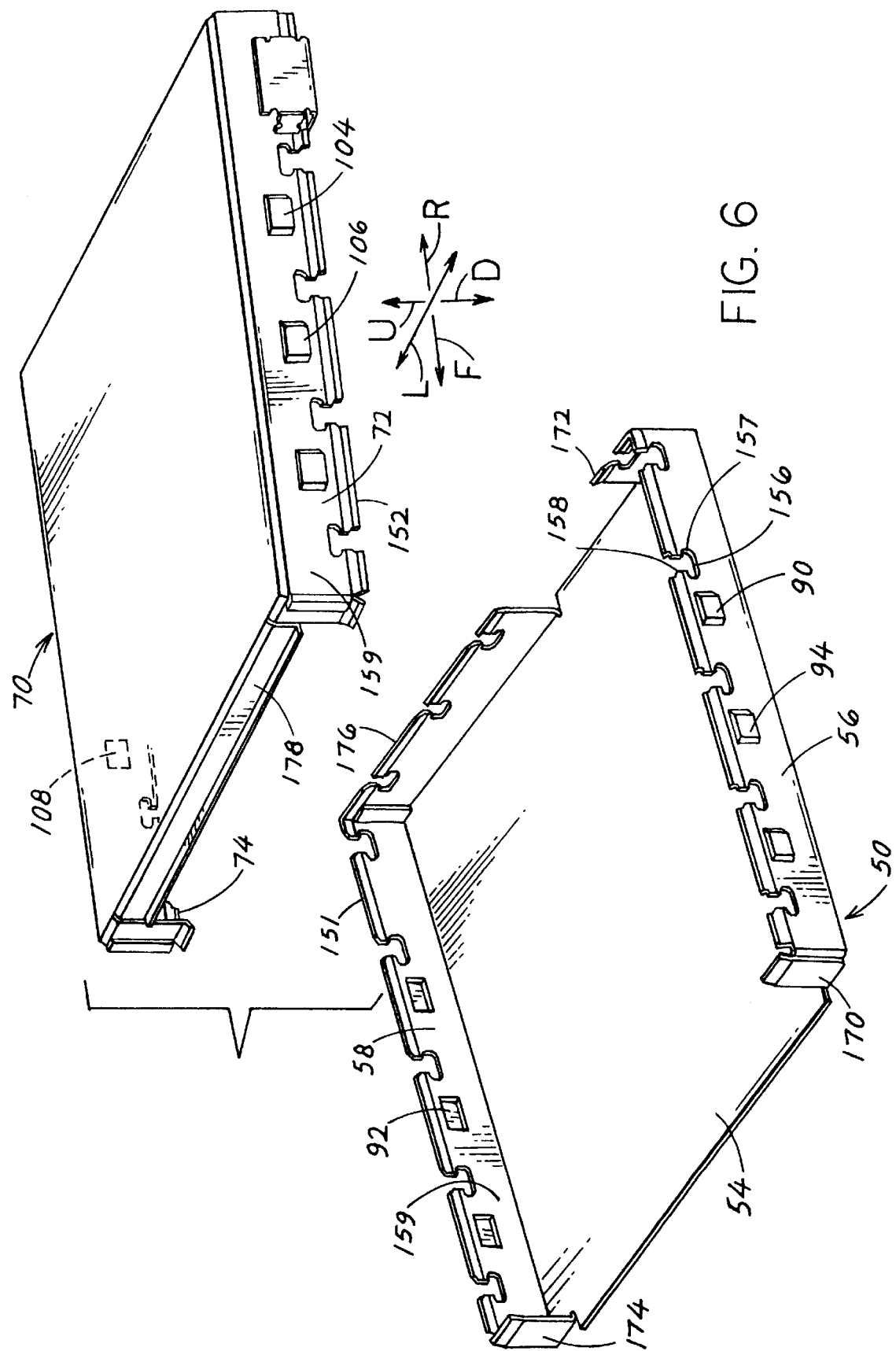
FIG. 6 is an exploded top and front isometric view showing the shields of the housing halves of the data card of FIG. 3.

FIG. 6 shows that each of the bottom shield side walls 56, 58 has a plurality of dimples 90 punched outwardly to form a recess 92 on the inside and to form a projection 94 on the outside. The top shield 70 opposite side walls 72, 74 each have three dimples 104, with outwardly-projecting outer sides or projections 106 and corresponding recesses 108 on their inner sides. When the top sheet metal shield 70 (with the plastic body thereon) is pushed over the bottom shield 50 (with its plastic body thereon) the projections 94 on the lower dimples 90 project into the recesses 108 on the upper dimples, to lock the top and bottom shields and their top and bottom housing halves together. Once the assembly is completed, its outside is seamless, without flash or defects that are commonly seen in ultrasonic welded housing halves.

Figure 8:
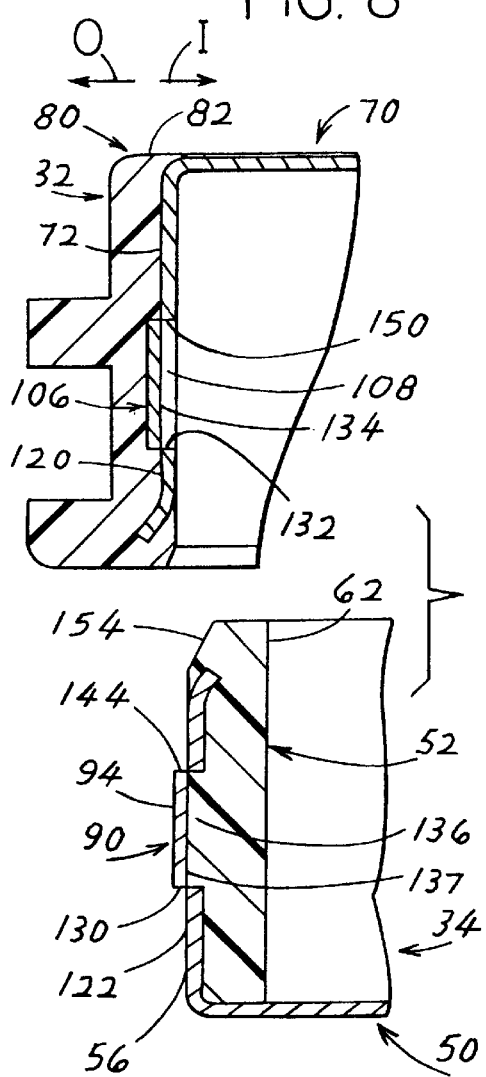
FIG. 8 is an exploded sectional view similar to that of FIG. 7, but with the top and bottom housing halves separated.
Figure 7:
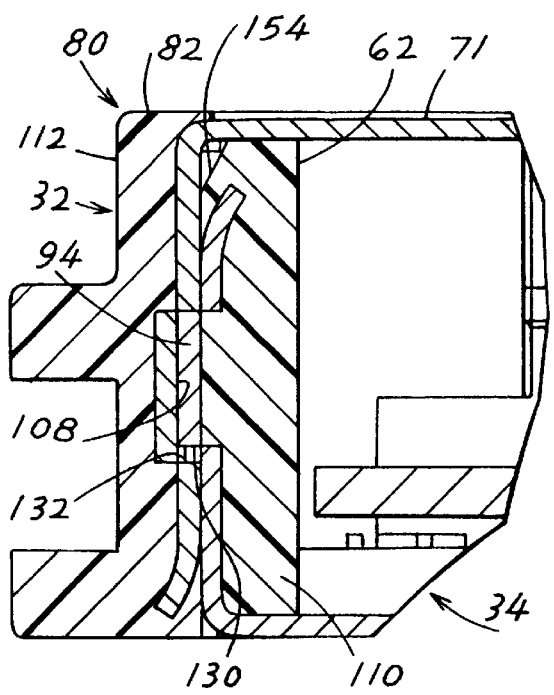
FIG. 7 is a sectional view taken on line 7—7 of FIG. 1.

FIG. 7 shows how adjacent sides 110, 112 of the bottom and top housing halves lock to each other when the top housing half 32 is moved down around the bottom housing half 34. As shown in FIG. 8, the top dimples 106 in the top sheet metal shield 70 of the housing half 32 project in an outward direction O from adjacent areas 120 of the side 72 of the top shield. The bottom dimples 90 in the lower shield 50 of the lower housing half 34 form projections 94 that project outwardly O beyond adjacent areas 122 of the side 56 of the bottom shield. The dimples are distinguished from resilient bendable arms with free ends that can be readily bent.

In FIG. 7, when the two housing halves are fully interlocked, the projections 94 fit into the recesses 108. Then downwardly-facing lower surfaces 130 on the projections lie adjacent to upwardly-facing lower surfaces 132 of the recesses, to prevent the top housing half 32 from pulling upwardly away from the lower housing half. As shown in FIG. 8, each of the body side beams 62 of the lower plastic body 52 and each of the body side beams 82 of the upper plastic body 80 extend beside the corresponding shield side. The lower body beam 62 has a part 136 that projects outwardly O into the lower dimple recess 137 and that lies inward I of and against the projection 94 to stiffen it. The upper body beam 82 has a depression at the upper dimple recess and the upper beam lies outward O and against the walls of the recess 108 and rigidizes the walls 134 of the recess.

FIGS. 11 and 12 show one of the lower housing dimples 90. The dimple has longitudinally M spaced opposite sides 140, 142 that merge with the adjacent area 122 of the sheet metal side 56 at bends 143, 145. However, the bottom dimple middle portion 147 has been substantially sheared or cut away from an adjacent side wall region 146 lying immediately below the lower surface 130. This allows the lower surface 130 to be substantially flat rather than having a rounded shape which would result from bending it instead of shearing it substantially clear of the adjacent location on the sheet metal side. As a result, the lower and upper surfaces 130, 144 of the dimple securely prevent separation of the assembled housing halves. The shearing leaves no gaps, or leaves gaps of less than 1 mm thickness and usually less than 0.2 mm thickness to assure blockage of electromagnetic energy. The top dimples of the top sheet metal shield are similarly constructed to form flat upper and lower surfaces. The upper surfaces 144, 150 (FIG. 8) of the projections and recesses are also useful to limit upward movement of the lower housing half, although the top main wall 71 (FIG. 7) also prevents such movement.

FIG. 6 shows that each of the shields has entrapment parts or tabs 151, 152 that lock the shield to the plastic molded body. An undercut slot 156 lies between each pair of adjacent tabs. Each slot is undercut because it has a wide deepest part 157 and a narrow neck 158. The undercut slot receives plastic of the plastic body during molding. The shield side walls are scored (indented fine lines not over 0.002 inch deep extending into the sheet metal) at 159 on the shield surface where plastic will flow, to improve adhesion.

FIG. 7 shows that the lower body has a tapered surface 154 that causes slight bending of the body sides as the housing halves are brought together, until the projections snap into the recesses. FIG. 3 shows that the lower molded plastic body 52 has laterally-extending front and rear body end beams 160, 164 and 162, 166 extending at right angles to the body side beams. The body end beams help resist bending of the side beams 60, 62, which would allow release of the upper housing half from the lower one. The upper plastic body is similarly constructed. The lower shield shown in FIG. 6, also has front and rear shield walls 170, 172, 174, 176 overmolded by the plastic body. The upper shield is similar, but with a long connecting top 178 lying over the front connector.

Figure 9:
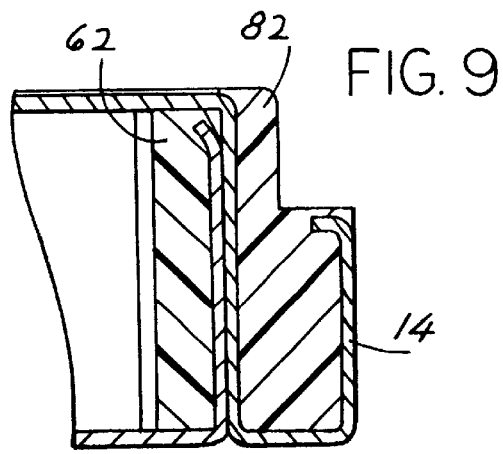
FIG. 9 is a sectional view taken on line 9—9 of FIG. 1.
Figure 10:
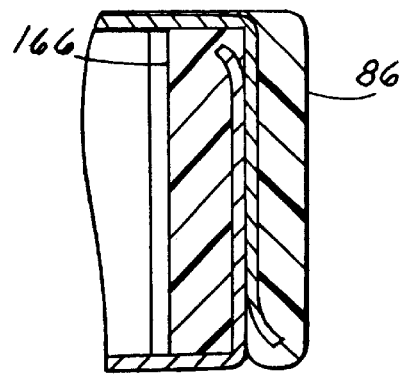
FIG. 10 is a view taken on line 10—10 of FIG. 2.

FIGS. 9, 10 and 13 show sectional views of the sheet metal shields and of the corresponding bodies, at different locations.

In a data card of the illustrated construction, the dimple locking results in resistance to separation of the housing halves by a force of over 100 pounds, which is about twice the force than can be withstood by an ultrasonically welded (of plastic bodies) card.

While terms such as "top", "bottom", "horizontal", etc. have been used to describe the invention as illustrated, it should be noted that the data card and its parts can be used in any orientation with respect to the Earth.

Thus, the invention provides a data card with a housing having top and bottom housing halves that can be joined around a circuit board in a simple and rugged manner. One of the housing halves such as the bottom one has outward projections, while the other housing part has inwardly-facing recesses that receive the projections. The projections and walls of the recesses are fixed with respect to the different locations on the housing half, and have substantially flat vertically-facing engaging surfaces to prevent separation of the housing halves after they have been joined. The projections and recesses are preferably formed by forming dimples in sheet metal shields of the top and bottom housing halves. Each dimple preferably has opposite sides that merge with adjacent locations on the shield, but with a bottom that is separated by shearing it from adjacent locations on the shield. The sheet metal shield is stiffened by molding the plastic bodies to the shields, especially the shield sides.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A data card housing, comprising:
   top and bottom housing halves, with each housing half including a sheet metal shield with a main wall lying in a primarily horizontal plane and with primarily vertical side walls that are laterally spaced apart, with each side wall having laterally spaced inner and outer side wall surfaces, with said inner surfaces facing each other and said outer surfaces facing away from each other;
   each of said side walls includes dimples with the side walls of said top housing half having top dimples and with the side walls of said bottom housing half having bottom dimples, and said side walls of said top and bottom housing halves overlap with said side walls of said bottom housing half lying within said side walls of said upper housing half, with said dimples of the overlapped side walls locked to each other to prevent separation of said housing halves;

said dimples are formed by pressing in a lateral direction, areas of the sheet metal of each side wall, with each dimple having opposite faces including a first face forming a recess with top and bottom recess surfaces facing respectively downward and upward, and including an opposite second face forming a projection with top and bottom projection surfaces facing respectively upward and downward, and said side walls of said bottom housing half are positioned with the recesses of said top dimples receiving the projections of said bottom dimples, and with the bottom surface of each bottom dimple projection lying vertically above and adjacent to the bottom surface of each top dimple recess to prevent the recess from moving upward.

2. The data card housing described in claim 1 wherein:

said bottom housing half includes a molded plastic body that is overmolded to said bottom side walls, with the plastic body of said bottom housing half filling the recesses of said bottom dimples.

3. The data card housing described in claim 1 wherein:

each of said bottom dimples has horizontally-spaced opposite dimple sides (140, 142) that merge with adjacent areas of the corresponding bottom side wall, and each of said bottom dimples has a bottom middle portion lying between said dimple sides with said bottom middle portion being separated from an area of the corresponding side wall that lies below the bottom middle portion, to leave a primarily flat dimple bottom surface.

4. The data card described in claim 1 wherein:

each of said side walls is elongated in a longitudinal direction which is perpendicular to said lateral direction, and said dimples are longitudinally spaced apart with undimpled areas between pairs of said dimples.

5. A data card which includes a circuit board assembly and a housing that surrounds the circuit board assembly to protect it, wherein:

said housing includes a bottom housing half that has a primarily horizontal bottom wall with opposite bottom sides, and laterally opposite bottom side walls that each extends generally upwardly from one of said bottom sides;

said housing includes a top housing half that has a primarily horizontal top wall with opposite top sides, and laterally opposite top side walls that each depends from one of said top sides, with said top housing half constructed to closely receive said bottom side walls between said top side walls;

each of said side walls includes a plate of sheet metal of predetermined thickness;

the top side walls have inner surfaces that face each other with said inner surfaces each having recesses with said recesses having bottom recess walls that form upwardly-facing lower surfaces;

the bottom side walls have projections that fit into said recesses and that form downwardly-facing surfaces, so said upwardly-facing surfaces of said recesses can abut said downwardly-facing surfaces when said bottom side walls are received between said top side walls.

6. The data card described in claim 5 wherein:

each projection in the side walls of said bottom housing half has a bottom edge that is separated from an adjacent area of one of the bottom side walls that lies immediately below the projection bottom edge, and each recess in the side walls of said top housing half has a wall with a top edge that is separated from an adjacent area of the top side wall that lies immediately above the recess.

7. The data card described in claim 5 wherein:

said projections in said bottom side walls form bottom recesses;

said upper and lower housing halves each includes a molded plastic body that is overmolded to a portion of the corresponding housing half, with the plastic body of said lower housing half filling each of said bottom recesses, and with the plastic body of said upper housing half lying against the outer side of each projection in the upper housing half side walls.

8. A data card housing comprising:

top and bottom housing halves, with each housing half including a main wall lying primarily in a horizontal plane and with each housing half including primarily vertical side walls that are elongated in a longitudinal direction;

the side walls of said top housing half include a plurality of recesses and the side walls of said bottom housing half include a plurality of projections, and said side walls of said top and bottom housing halves overlap and are locked to each other to prevent vertical movement of said housing halves by said projections projecting into said recesses;

said recesses have vertically-facing surfaces, and said projections have vertically-facing surfaces positioned to engage corresponding vertically-facing surfaces of said recesses, to prevent vertical movement of one of said housing halves with respect to the other when said projections lie in said recesses;

said vertical side walls each comprising sheet metal with said recesses and said projections each formed by partially punching out the sheet metal from vertically extending portions of said side walls.

9. The data card housing described in claim 8 wherein:

the projections in the side walls of said lower housing half have longitudinally-spaced projection slides that join adjacent portions of said side walls by bends, and have lower ends which are severed from adjacent portions of said side walls.

10. The data card described in claim 8 wherein:

said side walls have dimples in said sheet metal that form said recesses and projections;

the side walls of said top housing half extend vertically below said recesses therein and the side walls in said bottom housing half extend vertically above the projections therein.

* * * * *